US006097214A

United States Patent [19]

Troussel et al.

[11] Patent Number: 6,097,214

[45] Date of Patent: Aug. 1, 2000

[54] POWER OUTPUT STAGE FOR THE CONTROL OF PLASMA SCREEN CELLS

[75] Inventors: Gilles Troussel, Saint Martin d'Heres; Celine Lardeau, Grenoble, both of France

[73] Assignee: STMicroelectronics S.A., Gentilly, France

[21] Appl. No.: 09/083,831

[22] Filed: May 22, 1998

[30] Foreign Application Priority Data

May 22, 1997 [FR] France .................................. 97 06498

[51] Int. Cl.[7] .................... H03K 19/0175; H03K 19/094

[52] U.S. Cl. ................................ 326/63; 326/68; 326/83

[58] Field of Search ................................ 326/63, 68, 70, 326/71, 72, 83

[56] References Cited

U.S. PATENT DOCUMENTS 5,510,731 4/1996 Dingwall .................................. 326/63
5,926,055 7/1999 Kashmiri et al. ...................... 327/333

FOREIGN PATENT DOCUMENTS 0 351 820 A2 1/1990 European Pat. Off. .
37 30 649 A1 3/1989 Germany .
02283074 11/1990 Japan .
2 291 549 1/1996 United Kingdom .

OTHER PUBLICATIONS

Delgrange et al., "High–Voltage IC Driver for Large–Area ac Plasma Display Panels," in Society for Information Display International Symposium, Digest of Technical Papers, vol. 15, Jun. 5–7, 1984, Boulogne–Billancourt, France, pp. 103–106.

*Primary Examiner*—Michael Tokar
*Assistant Examiner*—Daniel D. Chang
*Attorney, Agent, or Firm*—Theodore E. Galanthay; Robert Iannucci; Seed IP Law Group PLLC

[57] ABSTRACT

The present invention relates to a power output stage for the control of plasma screen cells. It includes VDMOS-type N-channel charge and discharge transistors, the charge transistor being arranged to form a compound P-channel transistor. These transistors enable to issue a charge current to an output and to absorb a discharge current from this output. Two inverters are sized so that the potential of the control gate of the charge transistor drops more rapidly than the output potential when a discharge of this output is controlled. Thus, an output stage of limited bulk and without any risk of simultaneous conduction of the charge and discharge transistors is implemented.

17 Claims, 2 Drawing Sheets

POWER OUTPUT STAGE FOR THE CONTROL OF PLASMA SCREEN CELLS

TECHNICAL FIELD

The present invention relates to a power output stage for the control of plasma screen cells.

BACKGROUND OF THE INVENTION

A plasma screen is an array-type screen, formed of cells disposed at the intersections of lines and columns. A cell includes a cavity filled with a rare gas, two control electrodes and a red, green, or blue phosphor deposition. To create a light spot on the screen, by using a given cell, a potential difference is applied between the control electrodes of the cell, to trigger an ionization of its gas. This ionization goes with an emission of ultraviolet rays. The creation of the light spot is obtained by excitation of the deposited phosphor, by the emitted rays.

The cell control, to create images, is conventionally performed by logic circuits generating control signals. The logic states of these signals determine the cells which are controlled to generate a light spot and those which are controlled not to generate one. These logic circuits are generally supplied at low voltage, for example, with a supply voltage of 5 volts or less. This voltage is not sufficient to directly drive the cell electrodes. Between the logic circuits and the cells to be controlled, power output stages are thus used, to convert the low voltage control signals into high voltage control signals.

The ionization of the gas in the cavities requires the application of high potentials on the control electrodes, on the order of magnitude of one hundred volts. On the other hand, it is necessary to be able to provide the electrodes with (and, correlatively, to receive from these electrodes) significant currents, on the order of several tens of milliamperes. Indeed, the electrodes can be represented, schematically, by relatively high equivalent capacitances on the order of one hundred picofarads (and, correlatively, by current sources of some tens of milliamperes). The control of these electrodes is thus equivalent to the charge or discharge control of a capacitor. Now, it is desired, generally, in plasma screens, to obtain signals which have steep edges. This represents, for example, charge and discharge durations on the order of one hundred nanoseconds. Given the high potential to be reached and the high value of the capacitive load, this requires the ability of supplying and absorbing very high charge and discharge currents, which can reach one hundred milliamperes.

As mentioned, the control of the plasma screen electrodes is performed by power output stages receiving low voltage logic signals and converting these signals into high voltage control signals.

FIG. 1 illustrates a conventional example of embodiment of an output stage 1 enabling to control an electrode. Stage 1 includes a control input 2 and an output 4. Control input 2 receives a logic input signal IN1. It is assumed that this signal is a low voltage signal, which can take two states, a high state and a low state. The high state will be represented by a positive potential VCC, with for example VCC=5 V. The low state will be represented by a ground potential GND=0 V. Output 4 supplies an output control signal OUT1. This output signal is issued to an electrode, represented by an equivalent capacitor Cout mounted between output 4 and the ground. The electrode control consists of charging capacitor Cout, bringing it to a high voltage potential VPP, or discharging it, if charged. It will be assumed that the charge is ordered when signal IN1 is in the high state, and that the discharged is ordered when signal IN1 is in the low state.

Stage 1 includes a pair 6 of power transistors 8 and 10. These transistors are, typically, complementary VDMOS-type N-channel and thick oxide HVMOS-type P-channel power transistors. VDMOS refers to vertical N-channel MOS-type transistors, able to withstand high source-drain potential differences and issue or absorb significant currents. Thick oxide HVMOS refers to MOS-type P-channel transistors able to withstand high source-drain and source-gate potential differences. Transistor 8, of P-channel HVMOS type, receives potential VPP on its source. Its drain is connected to output 4 and its control gate receives a control signal INP. This transistor enables to charge capacitor Cout, when on. Transistor 10 then is off. Transistor 10, of N-channel VDMOS type, receives potential GND on its source. Its drain is connected to output 4 and its control gate receives a control signal INN. This transistor enables to discharge capacitor Cout, when on. Transistor 8 is then off. The control of discharge transistor 10 is implementable at low voltage. When INN=VCC, it is on, and when INN =GND, it is off. Thus, in circuit 1, signal INN is issued by an inverter 12 receiving signal IN1. A low voltage inverter will be used, powered by potentials VCC and GND. This inverter enables to invert the polarity of signal IN1 so that the charge and the discharge be controlled, respectively, by IN1=VCC and IN1=GND. The control of charge transistor 8 requires a high voltage control. Indeed, when INP=GND, transistor 8 is on, but to turn it off, signal INP has to be able to reach a potential at least equal to VPP. For this purpose, the control of transistor 8 is performed by a potential shifting circuit 14, circuit 14 being driven by input signal IN1.

Circuit 14 includes two MOS-type P-channel power transistors 16 and 18, and two N-channel MOS-type power transistors 20 and 22. Transistors able to withstand the high voltage will be used, for example, N-channel VDMOS transistors and thick oxide P-channel HVMOS transistors. Transistors 16 and 18 receive potential VPP on their sources. Transistors 20 and 22 receive potential GND on their sources. The drain of transistor 16 is connected to the control gate of transistor 18 and to the drain of transistor 20. The drain of transistor 18 is connected to the control gate of transistor 16 and to the drain of transistor 22. The drains of transistors 18 and 22 issue control signal INP. Transistor 20 receives signal INN on its control gate. Eventually, transistor 22 receives a control signal NIN on its control gate. This signal NIN is issued by an inverter 24, powered at low voltage, and receiving signal INN as an input. When INN=GND, transistors 20 and 22 are, respectively, off and on. Transistors 16 and 18 are, therefore, respectively on and off. Then, INP=GND. Charge transistor 8 is on and discharge transistor 10 is off. When INN=VCC, then transistors 20 and 22 are, respectively, on and off. Transistors 16 and 18 are, therefore, respectively off and on. Then, INP=VPP. Charge transistor 8 remains off and discharge transistor 10 is on.

A first problem raised by the circuit of FIG. 1 is the surface required to implement charge transistor 8. Indeed, given, on the one hand, the differences of conductivity of the P-channel and N-channel transistors and, on the other hand, the high values of the charge and discharge currents, transistor 8 occupies a surface on the order of two or three times as much as that occupied by transistor 10, with an equivalent current performance.

A second problem raised by the circuit of FIG. 1 is the risk of simultaneous conduction of output transistors 8 and 10, when input signal IN1 changes states. Such simultaneous conduction, when the control signals of transistors 8 and 10 are modified, causes a high dissipation, given the voltage and current values concerning these transistors.

SUMMARY OF THE INVENTION

According to principles of the present invention, an output stage structure is provided which enables to decrease the surface required for the charge transistor and to avoid a simultaneous conduction of the charge and discharge transistors at the state switchings of the input signal. For this purpose, an embodiment of the present invention provides to replace the P-channel charge transistor with an N-channel charge transistor arranged to form a compound P-type transistor, and to control the N-channel charge and discharge transistors by means of inverters sized to avoid any simultaneous conduction.

Thus, the embodiment of the present invention provides a power output stage for the control of plasma screen cells, including an input for receiving a low voltage logic input signal, an output for issuing a high voltage output control signal, an output circuit including, on the one hand, a charge transistor receiving a high voltage potential on a drain and having a source connected to the control output and, on the other hand, a discharge transistor receiving a reference potential on a source and having a drain connected to the output, and control means issuing control signals to the charge and discharge transistors to control these transistors according to the logic input signal. The charge and discharge transistors are of N-channel VDMOS type, the charge transistor being arranged to form a compound P-type transistor, and the control means are arranged so that the potential of the control gate of the charge transistor drops more rapidly than the output potential when the logic input signal controls a discharge of the output.

According to another embodiment of the present invention, the output circuit includes, on the one hand, a P-channel power transistor controlled by a potential shifting circuit, the P-channel transistor receiving the high voltage potential on a source and having a drain connected to a control gate of the charge transistor and, on the other hand, an N-channel power transistor having a source receiving the reference potential and having a drain connected to the control gate of the charge transistor, the P-channel and N-channel transistors being controlled so that the P-channel transistor is on when it is desired to turn on the charge transistor and so that the N-channel transistor is on when it is desired to turn off the charge transistor. The control means include low voltage inverters to control the N-channel transistor and the discharge transistor, the inverters being sized so that, on the one hand, the discharge transistor is turned on after the N-channel transistor is turned on, when it is desired to order the discharge of the output and, on the other hand, the N-channel transistor is off after the discharge transistor is off, when it is desired to order a charge of the output through the charge transistor.

According to another embodiment of the present invention, the control means are sized so that, when one of the P-channel and N-channel transistors of the output circuit is turned on, the other one of these transistors is previously turned off, to avoid any simultaneous conduction of these transistors.

According to another embodiment of the present invention, the stage includes logic filtering circuits for filtering the logic input signal to avoid a modification of the control signals of the power transistors of the stage if parasitic pulses of a duration lower than a given duration appear in the logic input signal.

The foregoing as well as other features and advantages of the present invention will be discussed in detail in the following non-limiting description of an embodiment of the present invention in connection with the accompanying drawings.

DETAILED DESCRIPTION OF THE INVENTION

Figure 2:
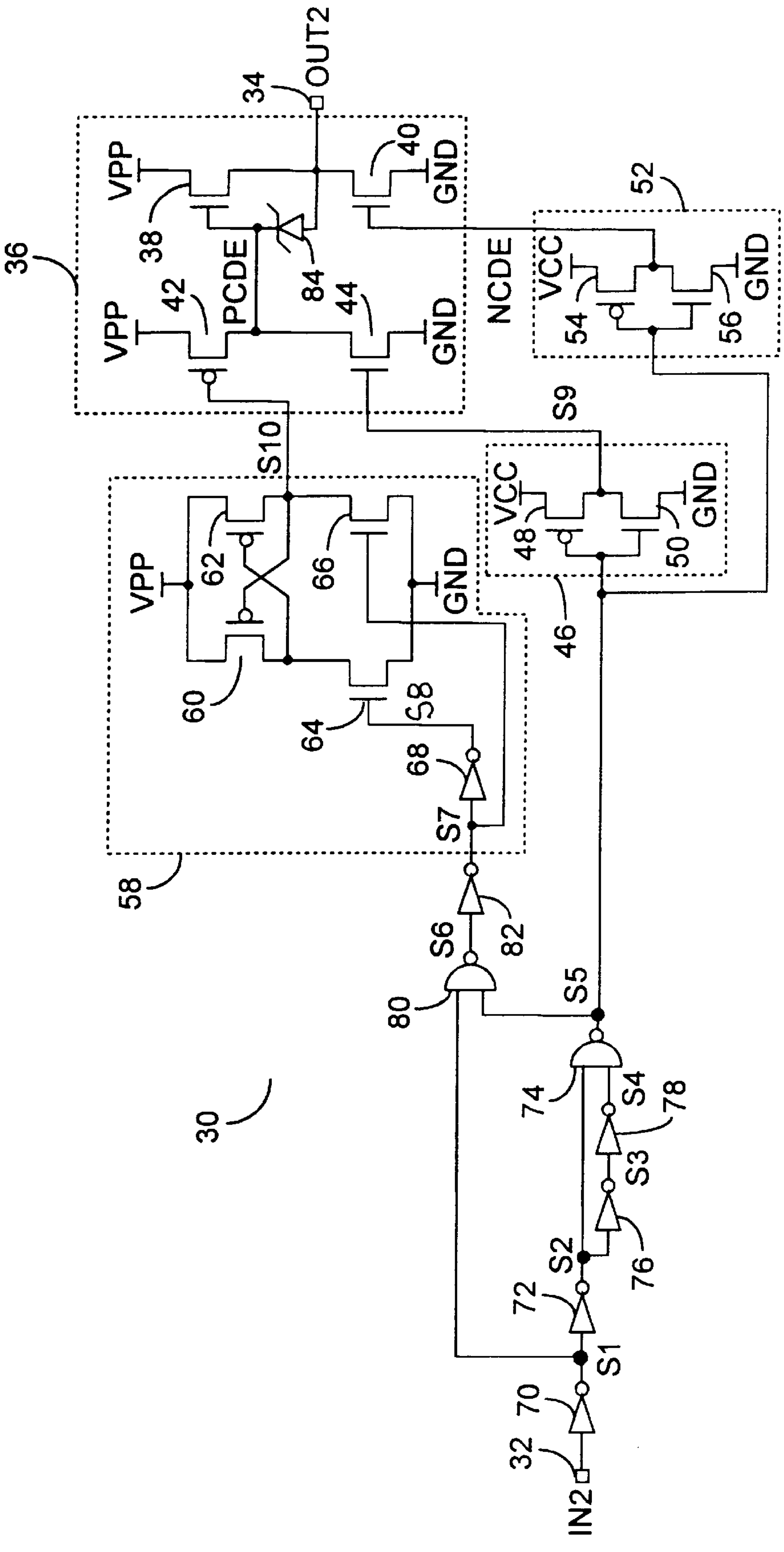
FIG. 2 illustrates an output stage according to an embodiment of the present invention.

FIG. 2 illustrates a power output stage 30 implemented according to an embodiment of the present invention.

Output stage 30 includes a control input 32 for receiving a logic input signal IN2 and an output 34 for issuing a high voltage output signal OUT2. Logic signal IN2 will be a low voltage signal, the potential of which will be representative of a given logic state: IN2=VCC, with VCC being a low voltage supply potential, will represent a high logic state, and IN2=GND, with GND being a reference potential (also called ground potential), will represent a low logic state. For example, VCC=5 V and GND=0 V. Signal IN2 will typically be issued by a logic circuitry, not shown, which will determine its logic state according to images to be formed.

Figure 1:
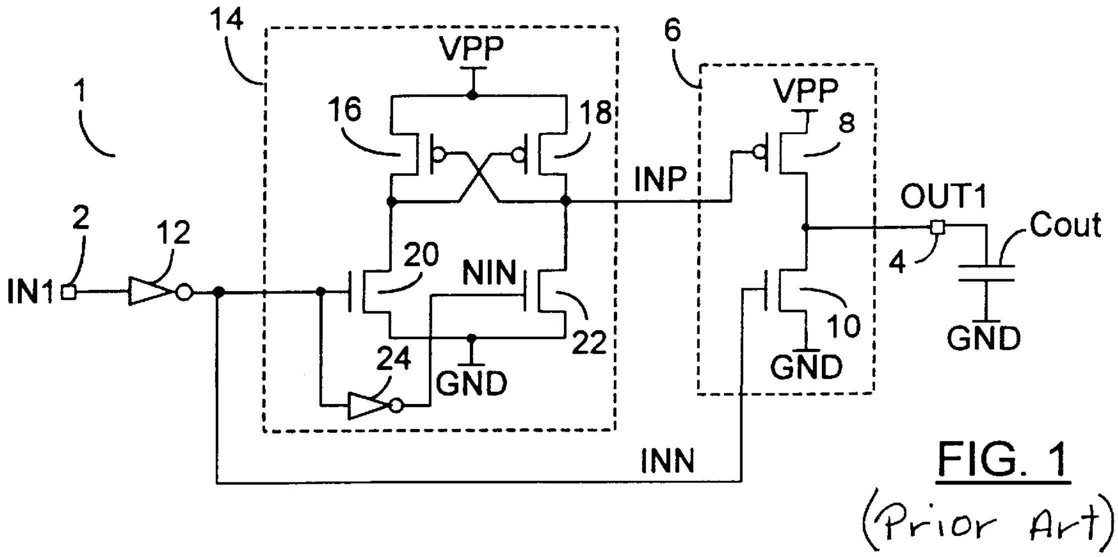
FIG. 1 (Prior Art)
FIG. 1 illustrates an output stage according to the prior art.

Output stage 30 includes an output circuit 36 enabling to connect the output 34 of stage 30 to a high voltage supply potential VPP or to ground potential GND. A high voltage supply potential VPP of 150 volts will for example be chosen. To control a plasma screen cell, not shown, this electrode is connected to output 34 of stage 30. This electrode will act as a capacitor, that can be charged or discharged, such as illustrated in FIG. 1.

Output circuit 36 includes two power transistors 38 and 40 enabling, respectively, to bring the potential of control output 34 to potential VPP and to potential GND. The drain of transistor 38, called the charge transistor, receives potential VPP. The source of transistor 40, called the discharge transistor, receives potential GND. The drain of transistor 40 and the source of transistor 38 are interconnected and form output 34. Charge transistor 38 enables to issue a charge current to output 34, to bring the potential of signal OUT2 substantially to the level of potential VPP. Discharge transistor 40 enables to absorb a discharge current supplied by source 34, to bring the potential of signal OUT2 substantially to the level of potential GND. If a capacitive load of 100 picofarads on output 34 and charge and discharge times on the order of 100 to 200 nanoseconds are considered, the charge and discharge currents will be on the order of 80 milliamperes.

Transistors 38 and 40 are N-channel VDMOS-type transistors, likely to provide and absorb significant currents and to withstand significant source-drain voltages. Transistors having a number of elementary cells, respectively, of 9*10 and 5*18 will for example be chosen. Output circuit 36 further includes two MOS-type power transistors 42 and 44 associated with charge transistor 38. These transistors 42 and 44, respectively a P-channel and an N-channel transistor, enable to form, together with transistor 38, a compound P-type transistor.

P-channel MOS-type transistor 42 receives potential VPP on its source. Its drain is connected to the control gate of charge transistor 38. It receives a control signal, noted S10, on its control gate. N-channel MOS-type transistor 44 receives potential GND on its source. Its drain is connected to the drain of transistor 42 and to the control gate of charge transistor 38. Its control gate receives a control signal noted S9. The signal received by the control gate of charge transistor 38, issued by transistors 42 and 44, is noted PCDE. The MOS-type transistor 42 may have a W/L ratio of 294/18 (with W/L being the transistor channel width/channel length ratio) and a VDMOS-type transistor 44, having a number of elementary cells of 6*2.

Power transistor 42 enables to turn on charge transistor 38. For this purpose, it is enough to supply a signal S10 such that transistor 42 is on. For example, S10=GND will be chosen. The potential of signal S9 will then have a value such that transistor 44 will be off. For example, S9=GND will be chosen. When transistor 42 is on, then the potential of signal PCDE increases, by the charge of the equivalent gate capacitor of charge transistor 38. Once PCDE reaches threshold voltage Vt of charge transistor 38, charge transistor 38 turns on and the potential on its source substantially reaches VPP−Vt.

To turn off charge transistor 38, transistor 44 is used. For this purpose, it is enough to impose, for example, S9=VCC and S10=VPP. Transistor 44 turns on and the equivalent gate capacitor of transistor 38 is discharged to the ground. During this discharge, of course, transistor 42 must be off. Thus, N-channel transistor 38 is controlled so that a low potential (S10=GND) turns it on and a high potential (S9=VCC) turns it off, which corresponds to the behavior of a P-channel transistor. Conversely, a charge transistor two or three times smaller than transistor 8 of FIG. 1 can be used, for an equal charge current.

Control signal S9 is generated by a low voltage inverter 46 formed of two complementary MOS-type transistors 48 and 50. P-channel transistor 48 receives potential VCC on its source. N-channel transistor 50 receives potential GND on its source. The drains of these transistors are interconnected and provide signal S9. The control gates of these transistors are interconnected and receive a logic control signal S5. Transistors 48 and 50 having, respectively, a W/L ratio of 100/5 and 50/3 will for example be chosen.

Control signal NCDE is generated by a low voltage inverter 52 formed of two complementary MOS-type transistors 54 and 56. P-channel transistor 54 receives potential VCC on its source. N-channel transistor 56 receives potential GND on its source. The drains of these transistors are interconnected and provide signal NCDE. The control gates of these transistors are interconnected and receive logic control signal S5. Transistors 54 and 56 having, respectively, a W/L ratio of 250/5 and 100/3 will for example be chosen.

Control signal S10 is generated by a potential shifting circuit 58, similar to that described for FIG. 1. Circuit 58 includes two MOS-type P-channel power transistors 60 and 62 and two MOS-type N-channel power transistors 64 and 66. Transistors able to withstand the high voltage will be chosen. Transistors 60 and 62 having, respectively, a W/L ratio of 50/18 and 100/18 and VDMOS-type transistors 64 and 66 having a number of elementary cells of 6*1 will for example be chosen.

Transistors 60 and 62 receive potential VPP on their sources. Transistors 64 and 66 receive potential GND on their sources. The drain of transistor 60 is connected to the control gate of transistor 62 and to the drain of transistor 64.

The drain of transistor 62 is connected to the control gate of transistor 60 and to the drain of transistor 66. The drains of transistors 62 and 66 provide control signal S10. Transistor 66 receives a logic control signal S7 on its control gate. Eventually, transistor 64 receives a control signal S8 on its control gate. This signal S8 is provided by an inverter 68, supplied at low voltage, and receiving signal S7 as an input. When S7=GND, transistors 66 and 64 are, respectively, off and on. Transistors 62 and 60 are, thus, respectively on and off. Then, S10=VPP. When S7=VCC, transistors 66 and 64 are, respectively, on and off. Transistors 60 and 62 are, thus, respectively on and off. Then, S10=GND.

Output stage 30 further includes logic circuits introducing delays. These delay circuits include inverters 70, 72, 76, 78 and 82, these inverters including an input and an output, and two logic gates 74 and 80, of NAND type, these gates including two inputs and one output. It is assumed that these circuits are supplied at low voltage, for example by potentials VCC and GND.

Inverter 70 receives input signal IN2 as an input and generates, on its output, logic signal S1, by inversion of signal IN2. This signal S1 is provided to a first input of gate 80 and to the input of inverter 72. This inverter 72 generates, on its output, a logic signal S2. This signal is provided to a first input of gate 74 and to the input of inverter 76. Inverter 76 generates on its output a logic signal S3. Signal S3 is provided to the input of inverter 78 which generates, on its output, a logic signal S4. Signal S4 is provided to the second input of gate 74. Gate 74 generates, on its output, logic signal S5 which is provided to inverters 46 and 52. Signal S5 is further provided to the second input of gate 80. This gate generates, on its output, a logic signal S6 which is provided to the input of inverter 82. Inverter 82 generates, on its output, logic signal S7 provided to potential shifting circuit 58.

The assembly formed by gate 74 and inverters 76 and 78 enables, as will be seen hereafter, to delay the positive pulses in input signal IN2. This assembly, concurrently with inverter 72 of gate 80, enables to delay the negative pulses in input signal IN2.

Figures 3A, 3B, 3C, 3D, 3E, 3F, 3G, 3H, 3I, 3J, 3K, 3L, 3M, 3N:
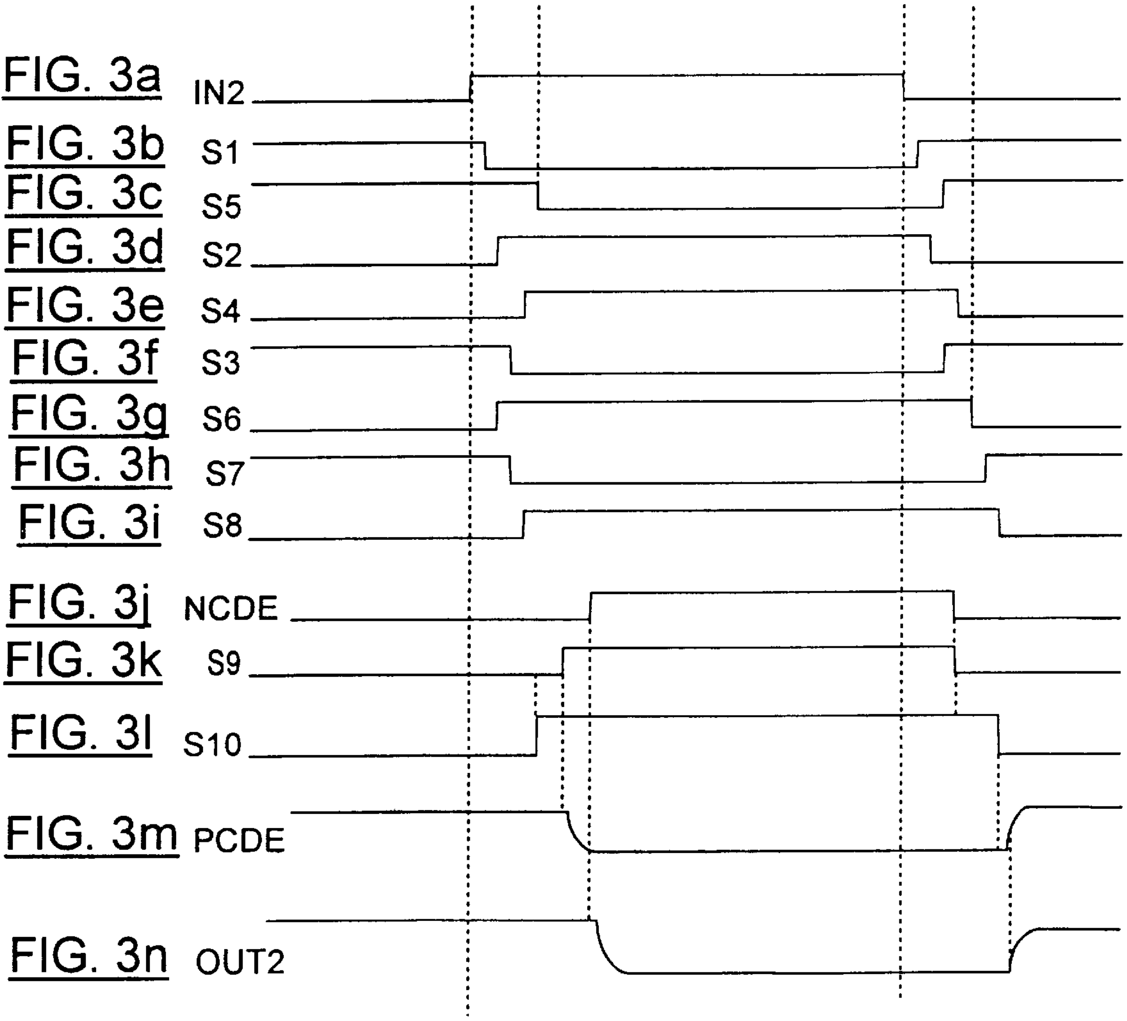
FIGS. 3*a* to 3*n* illustrate timing diagrams of signals and of potentials generated or issued by the output stage according to the embodiment of the present invention shown in FIG. 2.

The operation of circuit 30 will now be described, referring to FIGS. 3*a* to 3*n* which respectively illustrate logic input signal IN2, signal S1, signal S5, signal S2, signal S4, signal S3, signal S6, signal S7, signal S8, signal NCDE, signal S9, signal S10, signal PCDE, and output control signal OUT2.

It will be assumed that initially, S1=S5=S3=S7=VCC, PCDE=OUT2=VPP, and IN2=S2=S4=S6=S8=NCDE=S9=S10=GND. In other words, charge transistor 38 is on and discharge transistor 40 is off. The potential of signal OUT2 is thus substantially equal to potential VPP, neglecting the threshold voltage of transistor 38.

Assume that it is desired to control a discharge of control output 34 through discharge transistor 40. For this purpose, input signal IN2 is positioned in the high state. Then, IN2=VCC. Signal S1 will thus switch to the low state. This causes, on the one hand, a rise to the high state of signal S6 and, on the other hand, a rise to the high state of signal S2. Subsequently, signal S3 falls to the low state, and signal S4 rises to the high state. Once signal S4 has risen to the high state, signal S5 switches to the low state.

Inverters 76 and 78 enable to delay positive parasitic pulses, appearing in signal IN2. Indeed, as long as the transition to the high state of signal S2 has not propagated in inverters 76 and 78, signal S5 is maintained in the high state. To increase the minimum delay, the number of inverters placed between the output of inverter 72 and the second input of gate 74 may be increased, or the sizing of the transistors forming these inverters can be modified. A capacitor can also be placed between inverters 76 and 78. The delay of the positive edges in signal IN2 with respect to signals S9 and NCDE enables to avoid a simultaneous conduction in transistors 42 and 44 and in transistors 38 and 40. The turning-on of transistors 40 and 44 is delayed until transistor 42 is turned off by potential shifting circuit 58 controlled by signal S7.

The switching to the low state of signal S 1, in addition to the subsequent induced fall of signal S5, causes the switching to the high state of signal S6. This causes the switching to the low state of signal S7 and the subsequent rise to the high state of signal S8. This causes the switching to potential VPP of signal S10, which turns off transistor 42. If it is assumed that signal S9 then still is in the low state, potential PCDE is then maintained, by capacitive effect, at the level of the gate of charge transistor 38. A simultaneous conduction of transistors 42 and 44 is thus avoided.

When signal S5 switches to the low state, transistors 50 and 56 will turn off and transistors 48 and 54 will turn on. The capacitive load seen by transistor 50 being lower than that withstood by transistor 54, the potential of signal S9 will increase more rapidly than the potential of signal NCDE. The control gate of charge transistor 38 will thus be discharged more rapidly than output 34, thus ensuring that transistor 38 always remains off during the discharge of output 34. Knowing the output charge of inverters 46 and 52, transistors 48 and 54 have indeed been sized accordingly. Thereby, when transistor 40 turns on, transistor 38 remains off, which suppresses the simultaneous conduction phenomenon in these transistors. Once transistor 40 is on, the potential of signal OUT2 will drop to reach potential GND.

Assume that subsequently, it is desired to control the charge of output 34. For this purpose, input signal IN2 will be positioned to the low state. Then, IN2=GND.

Signal S1 will rise to the high state. This will cause the switching to the low state of signal S2. Accordingly, signal S5 will rise to the high state, independently from signals S3 and S4 which, concurrently, will respectively switch to the high state and to the low state. Accordingly, transistors 48 and 54 will be turned off and transistors 50 and 56 will be turned on. By sizing transistors 50 and 56 so that the potential of signal NCDE drops more rapidly than that of signal S9, transistor 40 will be turned off before turning off transistor 44.

The rise of signal S5 causes, concurrently, the fall of signal S6. In the same way as, previously, the positive pulses were delayed with inverters 76 and 78, here, the negative pulses will be delayed with inverter 72 and gate 74. This delay enables to ensure that transistors 40 and 44 are effectively off before the turning-on of transistor 38. As previously, this delay is implemented in low voltage logic circuits located at the input, which enables to avoid the occurrence of simultaneous conduction phenomena in the power transistors.

The switching to the high state of signal S6 causes the falling to the low state of signal S7 and, accordingly, the rising to the high state of signal S8. Accordingly, transistor 66 will turn on and the potential of signal S10 will fall to GND. Transistor 42 will then be turned on. Since it is on, the potential on the gate of charge transistor 38 will increase. It is assumed that transistor 44 is then, of course, off, to avoid any simultaneous conduction in transistors 42 and 44. For this purpose, inverters 82 and 68 will be sized accordingly, knowing the load withstood by transistor 50. Transistor 38 will thus turn on and the potential of signal OUT2 will increase. At this time, transistor 40 being off, there can be no simultaneous conduction of transistors 38 and 40.

Thus, the present invention enables to have an output stage which is both of small bulk and optimized as concerns simultaneous conduction problems.

As has been seen, when a discharge of output 34 is controlled, the circuit is optimized so that charge transistor 38 is off before discharge transistor 40 turns on. For this purpose, a potential drop of signal PCDE which is faster than the potential drop of signal OUT2 must be ensured. Indeed, in the opposite case, a positive gate-drain potential difference may appear at the level of charge transistor 38, especially if the capacitive load associated with output 34 is low. In this case, since transistor 38 is an N-channel transistor, transistor 38 would be turned back on and there would be a simultaneous conduction phenomenon. To avoid the occurrence of this phenomenon, transistor 42 is thus controlled so that it discharges the control gate of charge transistor 38 faster than transistor 40 discharges output 34.

Note Cgd the gate-drain capacitance of a transistor, Csd its source-drain capacitance, Cg the equivalent capacitance on the gate, Csub its substrate capacitance, Cs the capacitive load connected to output 34, C(34) the equivalent capacitance of output 34 and Vt the threshold voltage of the N-channel transistors.

At the transition from the charge to the discharge of the output, currents issued by transistors 54 and 48 will charge the gate-drain capacitances of transistors 40 and 44. These currents are all the higher as variation dV/dt of the potential of signal OUT2 is high. These currents reduce the gate-source potential difference of transistors 40 and 44. By reducing the on-state resistance Ron of transistor 48, a higher gate-source potential difference is applied for transistor 44. Thereby, the falling of the gate potential of charge transistor 38 is accelerated with respect to its source.

Cg(38)=Cgd(38)+Csd(42)+Csub(44) and

C(34)=Cs+Csd(38)+Csub(40).

Further:

Vgs(44)=VCC−Ron(48)*Cgd(44)*dV/dt(PCDE) and

Vgs(40)=VCC−Ron(54)*Cgd(40)*dV/dt(OUT2)

As concerns the transitions from the discharge to the charge of output 34, it will be seen to it that the following conditions are satisfied:

Ron(50)*Cgd(44)*dV/dt(PCDE)<Vt(44) and

Ron(56)*Cgd(40)*dV/dt(OUT2)<Vt(40).

Advantageously, for avoiding the logic circuits of the output stage 30 to be upset by the discharge of the output 34, the source of transistor 40 is connected to an analog ground for sinking the discharge current provided by this output 34, and another ground will be used for the other components of the output stage.

In the output stage 30, a security device is provided, shown by a Zener diode 84 connected between the output 34 and the control gate of transistor 38. This Zener diode avoids a too high potential difference from appearing between the control gate and the source of transistor 38. The presence of this diode creates a possible discharge path of output 34 towards the source of transistor 44. This is not a drawback in as much as the control of transistors 44 and 40 is implemented by devices of the same type, the inverters 46 and 52. If the characteristics of these devices vary, for example due to variations of the manufacturing method or of the operating temperature, these variations will be of the same nature for both inverters 46 and 52. Therefore, the influence of the variations of the characteristics of these inverters on the operation of the output stage will be very limited. Thus, it is easy to simultaneously obtain a protection of transistor 38 and a proper operation of the stage, by selecting the size of inverters 46 and 52 so that the largest portion of the discharge current of the output is sunk by the discharge transistor 40 which has this function, rather than by transistor 44.

Of course, the present invention is likely to have various alterations, modifications, and improvements which will readily occur to those skilled in the art. Thus, the polarity of the logic signals can be modified and/or these signals can be generated with different logic gates. It could be chosen, for example, to reverse the polarities of the control signals and use NOR-type gates instead of the NAND gates.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A power output stage for the control of plasma screen cells, comprising:

an input for receiving a low voltage logic input signal, a control output for issuing a high voltage output control signal, and an output circuit including a charge transistor receiving a high voltage potential on a drain and having a source connected to the control output and a discharge transistor receiving a reference potential on a source and having a drain connected to the control output, and a control circuit issuing control signals to the charge and discharge transistors to control these transistors according to the logic input signal, wherein the charge and discharge transistors are of N-channel VDMOS type, the charge transistor being arranged to form a compound P-type transistor, and wherein the control circuit is arranged so that a potential of a control gate of the charge transistor drops more rapidly than the output potential when the logic input signal controls a discharge of the control output.

2. The power output stage of claim 1 wherein the output circuit includes a P-channel power transistor controlled by a potential shifting circuit, the P-channel power transistor receiving the high voltage potential on a source and having a drain connected to a control gate of the charge transistor and an N-channel power transistor having a source receiving the reference potential and having a drain connected to the control gate of the charge transistor, the P-channel and N-channel power transistors being controlled so that the P-channel power transistor is on when it is desired to turn on the charge transistor and so that the N-channel power transistor is on when it is desired to turn off the charge transistor, and wherein the control circuit includes low voltage inverters to control the N-channel power transistor and the discharge transistor, the inverters being sized so that the discharge transistor is turned on after the N-channel power transistor is turned on, when it is desired to order the discharge of the control output and the N-channel power transistor is turned off after the discharge transistor is turned off, when it is desired to order a charge of the control output through the charge transistor.

3. The power output stage of claim 2 wherein the control circuit is sized so that, when one of the P-channel and N-channel power transistors of the output circuit is turned on, the other one of these transistors is previously turned off, to avoid any simultaneous conduction of these transistors.

4. The power output stage of claim 1, further including logic delay circuits for delaying the logic input signal to avoid a modification of the control signals of the charge and discharge transistors of the stage if parasitic pulses of a duration lower than a given duration appear in the logic input signal.

5. A power output circuit for converting a logic signal of a low voltage to an output signal of a high voltage, the power output circuit comprising:

an input terminal coupled to receive the logic signal;

an output terminal;

a charge transistor of a first conductivity type having a first terminal coupled to a high voltage source, a second terminal coupled to the output terminal, and a control terminal;

a discharge transistor of the first conductivity type having a first terminal coupled to the output terminal, a second terminal coupled to a low voltage source, and a control terminal;

a control circuit for controlling a conductive state of the charge transistor and the discharge transistor, the control circuit having an input coupled to the input terminal, a first output coupled to the control terminal of the charge transistor, and a second output coupled to the control terminal of the discharge transistor, the control circuit being structured to render the charge transistor non-conductive before rendering the discharge transistor conductive and to render the discharge transistor non-conductive before rendering the charge transistor conductive based on the logic signal to alternately couple the output terminal to either the high voltage source or the low voltage source.

6. The power output circuit of claim 5, further comprising a control electrode of a cell in a plasma screen array coupled to the output terminal.

7. The power output circuit of claim 5 wherein the charge transistor and the discharge transistor are similarly sized.

8. The power output circuit of claim 7 wherein the charge transistor and the discharge transistor each comprise a VDMOS type transistor.

9. The power output circuit of claim 8 wherein the charge transistor and the discharge transistor each comprise an N-channel VDMOS type transistor.

10. The power output circuit of claim 5 wherein the high voltage source is greater than 90 volts.

11. The power output circuit of claim 5 wherein the control circuit comprises logic gates and transistors sized to produce delayed control signals at the first and second outputs based on the logic signal to render the charge transistor non-conductive before rendering the discharge transistor conductive and to render the discharge transistor non-conductive before rendering the charge transistor conductive.

12. The power output circuit of claim 5, further comprising:

a first inverter coupled to a transistor to control a voltage of the control terminal of the charge transistor;

a second inverter coupled to the control terminal of the discharge transistor; and wherein the first inverter and the second inverter are sized to reduce a potential of the control gate of the charge transistor more rapidly than a potential at the output terminal.

13. A method for converting a logic signal of a low voltage to an output signal at a high voltage, the method comprising:

generating a plurality of delayed control signals based on the logic signal;

rendering a high side transistor of a first conductivity type conductive with one of the control signals to couple a high voltage source to an output terminal;

rendering the high side transistor non-conductive with one of the control signals;

rendering a low side transistor of the first conductivity type conductive with one of the control signals to couple a low voltage source to the output terminal after the high side transistor has been rendered non-conductive; and rendering the low side transistor non-conductive with one of the control signals.

14. The method of claim 13 wherein the step of rendering a high side transistor of a first conductivity type conductive comprises rendering a first N-channel VDMOS type transistor conductive with one of the control signals to couple a high voltage source to an output terminal.

15. The method of claim 14 wherein the step of rendering a low side transistor of the first conductivity type conductive comprises rendering a second N-channel VDMOS type transistor conductive with one of the control signals to couple a low voltage source to the output terminal after the first N-channel VDMOS type transistor has been rendered non-conductive.

16. The method of claim 13 wherein the step of rendering a high side transistor of a first conductivity type conductive comprises rendering a high side transistor of a first conductivity type conductive with one of the control signals to couple a voltage source of greater than 90 volts to an output terminal.

17. The method of claim 13, further comprising the step of coupling the output terminal to a control electrode of a cell in a plasma screen array.

* * * * *